United States Patent [19]

O'Malley

[11] Patent Number: 5,630,270

[45] Date of Patent: May 20, 1997

[54] CIRCUIT BOARD IDENTIFICATION METHOD

[75] Inventor: Donna F. O'Malley, Raleigh, N.C.

[73] Assignee: Alcatel Network Systems, Inc., Richardson, Tex.

[21] Appl. No.: 485,681

[22] Filed: Jun. 7, 1995

Related U.S. Application Data

[62] Division of Ser. No. 205,196, Mar. 3, 1994.

[51] Int. Cl.$^6$ ...................................................... H05K 3/30
[52] U.S. Cl. .................. 29/832; 228/180.21; 228/180.22
[58] Field of Search ............................. 29/840, 832, 833; 228/180.21, 180.22

[56] References Cited

U.S. PATENT DOCUMENTS

| | | |
|---|---|---|
| 4,532,419 | 7/1985 | Takeda . |
| 4,667,403 | 5/1987 | Edinger et al. ................ 29/840 |
| 4,787,143 | 11/1988 | Yagi et al. ..................... 29/833 |
| 5,027,505 | 7/1991 | Nakamura et al. ............ 29/832 |

FOREIGN PATENT DOCUMENTS

| | | | |
|---|---|---|---|
| 62-2638 | 1/1987 | Japan | 257/656 |
| 62-61164 | 11/1987 | Japan | 257/693 |
| 3-228392 | 10/1991 | Japan | 29/840 |
| 5-283825 | 10/1993 | Japan . | |
| 2246478 | 1/1992 | United Kingdom | 361/783 |

*Primary Examiner*—Carl J. Arbes
*Attorney, Agent, or Firm*—Vinson & Elkins L.L.P.

[57] ABSTRACT

A circuit board having at least one operational characteristic. The circuit board includes a surface and a plurality of conductive pads accessible from the surface and for electrically coupling electrical components to one another. Further, the circuit board includes a plurality of attachment pads accessible from the surface. Lastly, the circuit board includes at least one identification component attached to at least one of the plurality of attachment pads, wherein the identification component comprises a marking for identifying said at least one operational characteristic. The identification component may or may not include an electrical characteristic. If an electrical characteristic is included, an in-circuit tester may be used to measure the electrical characteristic of the identification component and, thus, determine the identifier given the measurement. As an alternative, the measurement may be used to ensure the correct type of identification component is installed on the circuit board.

15 Claims, 2 Drawing Sheets

CIRCUIT BOARD IDENTIFICATION METHOD

RELATED APPLICATIONS

This application is a Divisional of co-pending application Ser No. 08/205,196, filed Mar. 3, 1994, and entitled "Circuit Board Identification Method and Apparatus".

This invention relates to circuit boards, and is more particularly directed to a method and apparatus for constructing a circuit board having an improved identification marking apparatus.

BACKGROUND OF THE INVENTION

Circuit boards are extremely prolific in all types of electrical equipment, such as computers, radio and video transmitters/receivers, telecommunication devices, appliances and so forth. Such boards, and the equipment housing the boards, are used by business, government, consumers, and others. Thus, the fabrication of such circuit boards, as well as the attachment of components to such circuit boards, has itself become an immensely large industry. The present invention involves an improved method and apparatus for constructing such circuit boards having an improved identification marking apparatus.

FIG. 1 illustrates one very popular circuit board designated generally at 10. Circuit board 10 includes a surface 12, and an edge 14 extending around the perimeter of the board. Although shown as rectangular, it should be noted that board 10 may be of any shape to accommodate specifications which, for example, may relate to the equipment within which board 10 will be installed. Circuit board 10 also includes various manufacturer's identifiers designated 16a, 16b, 16c, and 16d. Identifiers 16a-16d are often formed on surface 12 using a silkscreening process. These identifiers typically indicate information about the board such as the particular manufacturer, the board dimensions and so forth.

Circuit board 10 supports electrical components 17 attached to the board at least in part by an automated assembly machine. As known in the art, such machines are operable to quickly select from a plurality of machine-compatible components, and place the selected component on the circuit board. As an example, one popular automated assembly machine is a surface mount technology ("SMT") machine known in the art. As known in the SMT art, circuit board 10 includes a conductive configuration having surface conductors known as pads 18, and accessible from surface 12. Electrical components 17 are physically and electrically connected to pads 18 underlying each corresponding component as described below. Although not visible in FIG. 1, pads 18 are further interconnected underneath surface 12 by conductive members known in the art as tracks. The tracks permit pads 18 to electrically conduct with one another, thereby allowing electrical components connected to pads 18 to electrically connect to other such components. The shape and dimensions of pads 18 as illustrated are included merely by way of example. For purposes of illustration, only a few electrical components 17 are depicted; however, it should be understood that typically the entire span of pads 18 are connected to, and covered by, such components 17. Further, it should be understood that any shape and/or dimension may be used for pads 18 and the tracks connecting them, and such shape typically depends on the electrical components to be attached to board 10. Pads 18 are labeled in various locations throughout FIG. 1 to indicate that various conductors may be further coupled to one another by the underlying tracks, or may be disconnected from one another; in either case, the layout of pads 18 accommodates the particular circuitry and functionality to be attached to board 10.

Solder paste (not shown) is deposited over pads 18 so that electrical components 17 may thereafter be affixed to the paste and, hence, to circuit board 10. Thereafter, the SMT machine attaches numerous components to board 10. Particularly, the SMT machine selects each component from an array of SMT-compatible components. For example, components attached to reels of tape are often accessible to the SMT machine. The machine removes the selected component from its respective reel, and places it on circuit board 10 in an area of the solder paste. Accordingly, the solder paste temporarily retains the component 17 in contact with its corresponding pads 18 until subsequent processing. Note that the SMT machine can approach component placement times on the order of 25000 parts per hour, and with tolerances on the order of 0.006 inch. After the component is placed against the paste the board is heated and subsequently cools, causing the solder paste to correspondingly flow and harden, thereby adhering the components in place.

Because of its numerous uses and functions, it is desirable to label a circuit board to identify one or more of its characteristics. For example, once circuitry is affixed to the circuit board, the overall board provides certain functionality and, hence, an identifier(s) may be added to the board to denote its functionality. As another example, as the circuitry on a circuit board is revised, it is common in the industry to include, on the board, an indication of the version of the board. As yet another example, an identifier may be added to the board to denote the apparatus in which the board is to be placed. Still other identification purposes will be known, or become apparent, to a person skilled in the art. For purposes of this invention, any or all of these identification purposes of the circuit board are referred to as the board's "operational characteristics."

Under current SMT technology, a circuit board's operational characteristics are indicated directly on surface 12 of the circuit board and consist of one or more alphanumeric characters. The characters are often grouped so that, for example, a first group indicates a first characteristic, a second group indicates a second characteristic, and so on. For example, board 10 of FIG. 1 includes examples of such operational characteristic identifiers 20a, 20b, 20c, and 20d. The characters also may be highlighted or emphasized to group certain characters, thereby giving further meaning to their intended identification.

In the prior art, one method of forming operational characteristic identifiers labeled 20a-20d uses an ink process. Such a method is long known for other types of imprinting, such as is often used for creating nameplates, or in children's games or the like. Particularly, in the prior art, a human operator typically selects individual or grouped rubber stamps which combine to form the desired indication for the circuit board's operational characteristics. The operator cuts the rubber stamps from a strip, or chooses them from a larger group which includes the desirable stamp(s). The chosen stamp(s) are combined in the desirable order and affixed to the end of a stamping peg. Thereafter, the end of the stamping peg, and consequently the chosen rubber stamps, are depressed against an ink pad. Next, the inked end, and stamps, are pressed against the circuit board. Consequently, an ink impression remains on the circuit board and reflects the rubber stamps chosen by the operator.

The prior art process suffers many drawbacks. For example, the ink impression may not be evenly applied to the circuit board and, hence, may be illegible. As another example, the ink is subject to smearing while it remains wet, or may become obscured during subsequent handling of the circuit board. As still another example, the process of selecting stamps is subject to human error; namely, the operator may choose the wrong stamp(s), or place the stamp(s) in an inaccurate order. Such operator error could result in the circuit board being mistakenly used in the wrong environment or equipment, thereby causing failure of such equipment.

It is therefore an object of the present invention to provide an apparatus and method for constructing a circuit board having an improved identification marking apparatus.

It is a further object of the present invention to provide such an apparatus and method for minimizing human error and/or human resources involved in identifying the operational characteristics of a circuit board.

It is a further object of the present invention to provide such an apparatus and method for quickly affixing an identifier or identification marking to a circuit board.

It is a further object of the present invention to provide such an apparatus and method for accurately, consistently and efficiently affixing an identifier or identification marking to a circuit board.

It is a further object of the present invention to provide such an apparatus and method for permitting automatic verification that the correct identifier is located on a given circuit board.

It is a further object of the present invention to provide such an apparatus and method for permitting automatic determination of a circuit board's operational characteristics by electrically testing the identification component(s) on the board.

Still other objects and advantages of the present invention will become apparent to those of ordinary skill in the art having references to the following specification together with its drawings.

SUMMARY OF THE INVENTION

In the preferred embodiment, the present invention includes a circuit board having at least one operational characteristic. The circuit board includes a surface and a plurality of conductive pads accessible from the surface and for electrically coupling electrical components to one another. Further,the circuit board includes a plurality of attachment pads accessible from the surface. Lastly, the circuit board includes at least one identification component attached to at least one of the plurality of attachment pads, wherein the identification component comprises a marking for identifying the at least one operational characteristic.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
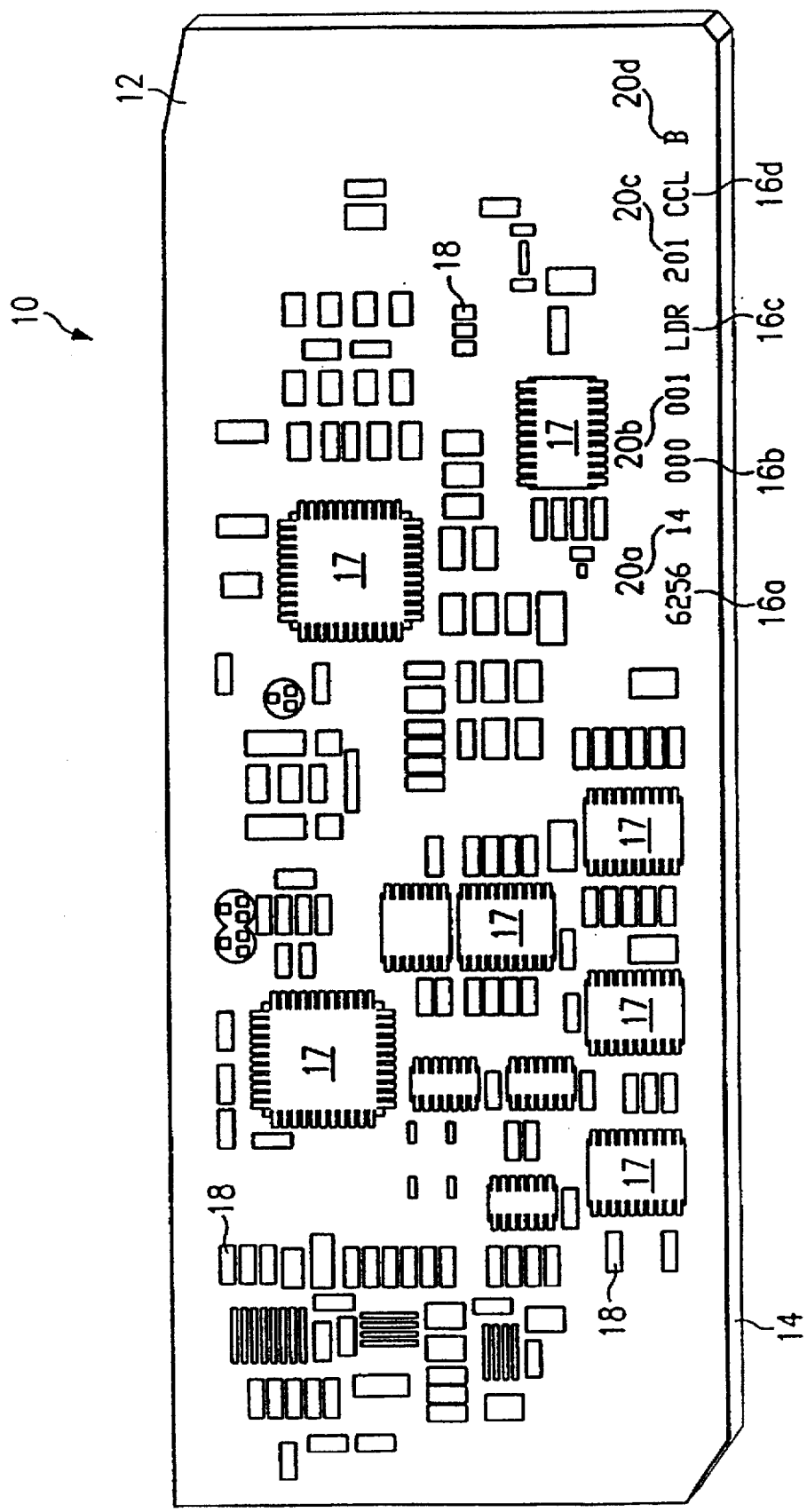
FIG. 1 illustrates a simplified diagram of a prior art circuit board having an identifier of the circuit board's operational characteristics formed using an ink process.
Figure 2:
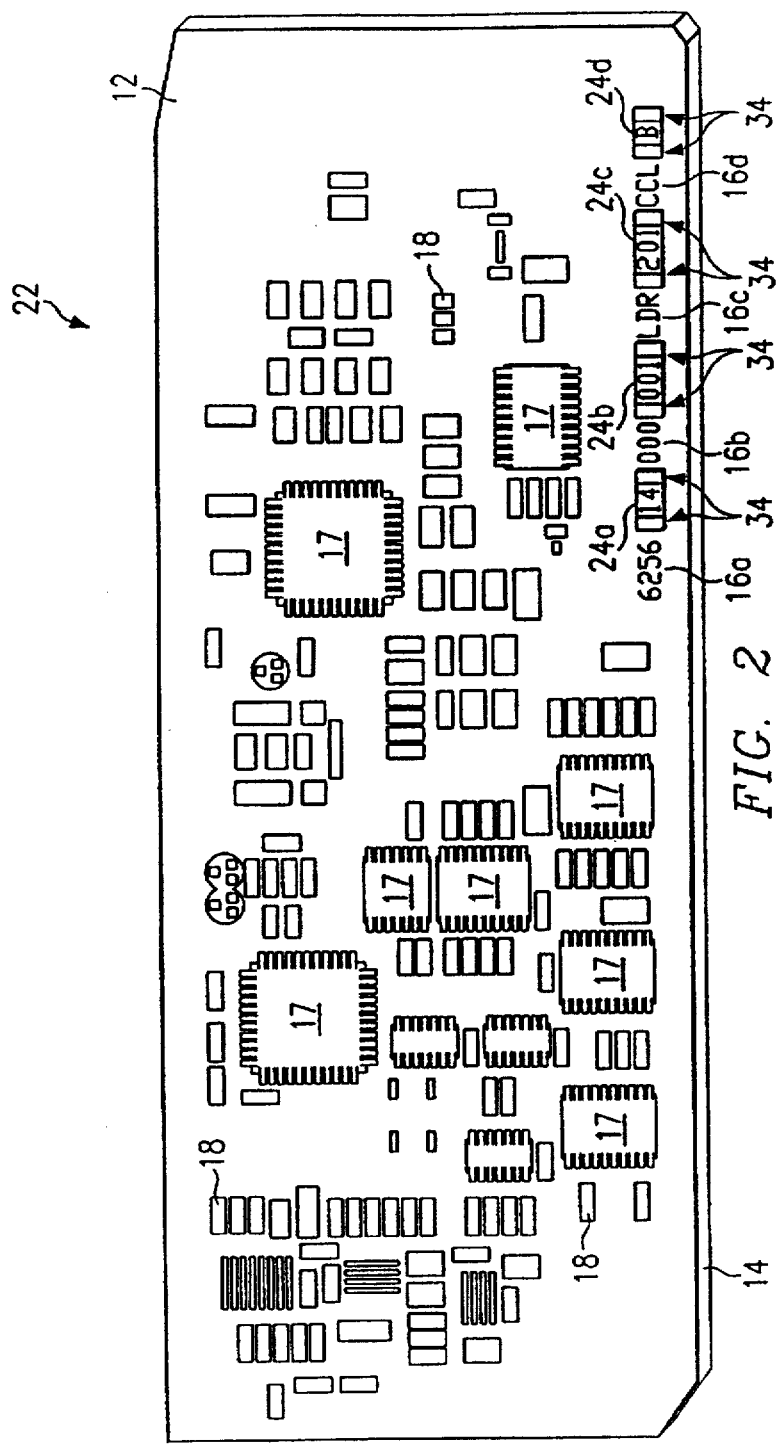
FIG. 2 illustrates a simplified diagram of a circuit board in accordance with the present invention and having an identifier of the circuit board's operational characteristics formed using selected components such as the one shown in FIG. 3.
Figure 3:
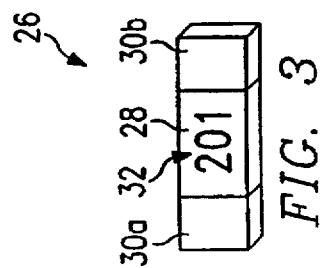
FIG. 3 illustrates an identification component used in FIG. 2 to form a portion of the identifier of the circuit board's operational characteristics.

The preferred embodiments of the present invention and their advantages are best understood by referring to FIGS. 1 through 3 of the drawings, like numerals being used for like and corresponding parts of the various drawings.

FIG. 2 illustrates a circuit board in accordance with the present invention, and designated generally at 22. Various features of board 22 are the same as the prior art board of FIG. 1 and, thus, reference numerals from FIG. 1 are carried forward to FIG. 2 to illustrate such features. Particularly, board 22 includes a surface 12, an edge 14 extending around its perimeter, manufacturer's identifiers 16a, 16b, 16c, and 16d, electrical components 17, and numerous conductive pads 18.

In contrast to board 10 of FIG. 1, however, board 22 of FIG. 2 includes improved apparatus forming novel operational characteristic identifiers labeled 24a, 24b, 24c, and 24d. Identifiers 24a–24d, like prior art identifiers 20a–20d, comprise alphanumeric characters and serve to indicate the operational characteristics of circuit board 22. The formation of, and automated processes regarding, identifiers 24a–24d, however, is vastly different than that of the prior art, and is described in greater detail in connection with FIG. 3, below.

FIG. 3 illustrates an identification component denoted generally at 26. As detailed below, identification component 26 is attached to board 22 to form identifier 24c shown in FIG. 2. Identification component 26 is constructed to be compatible with the automated assembly machine. (e.g., SMT) which corresponds to circuit board 22. Thus, in the example of SMT technology, identification component 26 includes a body 28 and end caps 30a and 30b. Typical SMT components are fairly small, and may be on the order of 0.005 inches in length, 0.002 inches in width, and 0.001 inches in height. Accordingly, identification component 26 is preferably constructed of like dimensions.

Although identification component 26 is physically shaped in a manner similar to ordinary SMT-compatible components, in the preferred embodiment component 26 is formed of materials and nature not to intentionally include any active or passive electrical elements. Of course, the material used to construct component 26 may have some negligible electrical effect (e.g., capacitance), but it is intended for purposes of the present invention that such attribute is minimal when compared to the active or passive electrical components, such as electrical components 17 which are, or will be, connected to conductive pads 18.

Identification component 26 further includes a alphanumeric identifier 32, preferably formed along body 28. Alphanumeric identifier 32 is preferably formed in the same manner which part designations are typically formed on SMT-compatible components. For example, SMT capacitors have their capacitance values denominated along the component's body. The techniques for imprinting such values are known in the SMT art, and are incorporated herein by reference. For example, one known technique for imprinting alphanumeric characters on an SMT components involves forming the value on a silkscreen, and then impressing the paint from the silkscreen to the surface of the component.

Although alphanumeric identifier 32 is formed in the same manner as a part designation, identifier 32 serves a different function. Particularly, rather than identifying the individual component on which the identifier is placed, alphanumeric identifier 32 identifies, either in part or in whole, the operational characteristics of circuit board 22.

Thus, in the example of FIG. 3, the identifier "201" is a portion of the overall identifier for the operational characteristics of board 22 shown in FIG. 2.

As mentioned above, identification component 26 is attached to board 22. Specifically, component 26 is attached to board 22 by the automated assembly machine (e.g., SMT machine) in the same general manner as electrical components 17, but is placed in the location of identifier 24c. More particularly, in the preferred embodiment, a plurality of attachment pads indicated generally by arrows 34 are located on surface 12 of board 22. In the perspective of FIG. 2, attachments pads 34 are not visible because they underlie identification components 24a–d in the same manner that conductive pads 18 underlie electrical components 17. Moreover, in the preferred embodiment, attachment pads 34 are formed on surface 12 in the same manner as conductive pads 18; however, one preferred difference is that attachment pads 34 are not electrically coupled by an underlying conductive track as are conductive pads 18. The tracks are unnecessary in connection with attachment pads 34 because component 26 preferably includes no electrical functionality. Moreover, because attachment pads 34 include no electrical tracks between one another, or between them and conductive pads 18, the location in which identification components 26 is placed on board 22 will not electrically communicate with pads 18 and, thus, not interfere with other electrical components 17 (or others not shown) on board 22. Thus, in the preferred embodiment, solder paste or the like is pre-located on attachment pads 34 in the area where identification component 26 is to be affixed to board 22, and in a manner that does not electrically communicate with pads 18. Thereafter, identification component 26 is placed on board 22 so that its end caps 30a and 30b adhere to the specially-located solder paste on the underlying attachment pads 34.

Either before or after affixing identification component 26 to board 22, electrical components 17, which perform the board's electrical functions, may be placed on board 22 in the manner described above, that is, in the necessary locations to align with conductive pads 18. Finally, board 22 is heated and allowed to cool, thereby softening and re-hardening the solder paste to adhere identification component 26 (or multiple identification components if more than one is used), as well as the electrical components, in the positions at which they have been placed on board 22.

From the above, therefore, reference to FIG. 2 illustrates that the exemplary identifier of FIG. 3, namely, the "201" designation, is part of the overall identifier of the board's operational characteristics. Moreover, one skilled in the art should appreciate that the remainder of identifiers 24a, 24b, and 24d may likewise be formed using components similar to identification component 26, but with different specific identifiers which, either separately or collectively, describe the operational characteristics of board 22.

As stated above, identification component 26, and like identification components (e.g., 24a, 24b, and 24d in FIG. 2), preferably include no electrical functionality. In an alternative embodiment, however, an identification component 26 or components are formed with electrical characteristics, and affixed to board 22 in the manner described above, that is, such that the lack of conductive tracks electrically insulates identification components 26 from conductive pads 18 and the electrical components 17 connected to such pads. Having used electrical characteristics in identification component 26, at least two additional inventive aspects are provided, as discussed after the following prior art description of circuit board testing.

As known in the art, circuit boards such as board 22 are typically tested on an "in-circuit tester" once all electrical components 17 are attached to the board. The in-circuit tester includes a so-called bed of nails which consists of a plurality of vertically disposed conductors. A circuit board, such as boards 10 and 22, includes a plurality of conductive pads on its underside for contacting the bed of nails, and corresponding to the conductive pads 18 on its upper surface 12. Consequently, for testing, board 22 is placed over the bed of nails such that each testing nail contacts a corresponding underside conductive pad. Thereafter, the in-circuit tester, according to a computer program, cycles board 22 through various tests to ensure the proper electrical components 17 are placed on the board and are properly operational, and to ensure such components are properly coupled to one another.

Given the present invention, and further using the alternative embodiment of identification components having electrical functionality, note at least two additional inventive aspects are provided. In the alternative embodiment, an additional number of conductive pads are formed on the underside of board 22 to correspond to, and in electrical contact with, attachment pads 34. These underlying conductive pads, in combination with the electrical characteristics of the identification component(s), may be measured by the in-circuit tester: (1) to verify that the correct identification component(s) has been used; and (2) to identify the operational characteristics of board 22.

For verifying identification components, note with reference to FIG. 2 that the identification component forming identifier 24a is labeled "14". Assume further that each identification component bearing the legend 14 is constructed to have a known electrical characteristic, such as a resistance of 10 Ohms. Accordingly, the in-circuit tester is programmed to measure resistance by contacting the underside conductive pads in electrical contact with identification component 24a. If the test measures 10 Ohms (within the given tolerance), then it confirms that the correct identification component 24a is in place. If, however, the test measures a resistance outside of 10 Ohms, it concludes that an incorrect identification component 26 has been placed on board 22. Accordingly, such a conclusion may be indicated or recorded so that the error may be later corrected.

For identifying the operational characteristics of board 22, note with reference to FIG. 2 that the combination of identification components forming identifiers 24a–d are collectively labeled "14 001 201 B." Assume further that each identification component 26 has a known electrical characteristic, such as 10 Ohms for a component labeled "14", 20 Ohms for a component labeled "001", 30 Ohms for a component labeled "201", and 40 Ohms for a component labeled "B." Accordingly, the in-circuit tester is programmed to test the underside conductive pads in electrical contact with identification components 24a–d. Once the tester measures the electrical characteristics of the four identification components, a look up table or the like is consulted to determine the particular identifiers; that is, the table indicates the identifiers corresponding to 10 Ohms, 20 Ohms, 30 Ohms, and 40 Ohms, respectively. As a result, the combination of "14 001 201 B" is located. Accordingly, the overall identifier of board 22 is automatically detected by the tester.

Automatic component or board identification may be used for various purposes. For example, in-circuit testers are operable to test different types of boards. Typically, a user enters the operational characteristics of a board, and the tester proceeds by performing its tests according to the parameters expected from a board having the stated operational characteristics. Given the above, the in-circuit tester could identify the operational characteristics of the board by itself, without the need of user input. As another example, automatic board identification could be used to tabulate records regarding the boards, such as the number of boards tested over a given period. As still another example, boards could be provided with sequential identification components, and a record could be created, according to specific legends of the identification components, of the testing results for each board. Thus, if a particular board fails a test, the record may be later evaluated to identify the failed board from the remainder of the boards which were tested. In any event, the alternative embodiment provides yet additional automation, with resultant benefits such as reduced human error and resources, and increased efficiency.

Having described the preferred embodiments of the present invention, it may be appreciated that such embodiments provide an improved method and apparatus for constructing a circuit board having an improved identification marking apparatus. By placing the operational characteristic identifier on an automated assembly machine component, the compatible automated machine may select and place such components very quickly and with accurate precision on the circuit board. Further, the possibility of human error and/or mismarking is significantly reduced in identifying the operational characteristics of a circuit board. Moreover, while the present invention has been described in detail, various substitutions, modifications or alterations could be made to the descriptions set forth above without departing from the invention. For example, various identification components may be formed with different partial identifiers, so that selected components may be combined with one another to form different overall identifiers. Alternatively, an entire identifier may be formed on a single component and, thus, that particular component would be affixed to the circuit board and, by itself, would identify the board's operational characteristics. As another example, identification components could be used to form the manufacturer's identifiers as well. As yet another example, while SMT technology has been described, the invention may apply to other types of boards and/or components. Thus, each of these examples, as well as others apparent to a person skilled in the art, demonstrates the scope of the invention as defined by the following claims.

I claim:

1. A method of assembling a circuit board comprising at least one operational characteristic and a surface, comprising the steps of:

affixing an alphanumeric identifier to an identification component, wherein the identification component has a measurable electrical characteristic;

affixing the identification component to the surface, wherein the alphanumeric identifier identifies the at least one operational characteristic; and wherein said step of affixing the identification component to the comprises placing the identification component adjacent a solder paste attached to the surface; and heating the solder paste after said placing step.

2. The method of claim 1 wherein said circuit board further comprises a plurality of conductive pads accessible from the surface and for electrically coupling electrical components to one another to form an electrical configuration, and wherein said placing step comprises placing the identification component at a location on the surface to not electrically communicate with the electrical configuration.

3. The method of claim 1 and further comprising the steps of:

measuring the electrical characteristic of the identification component after said recited affixing steps; and determining the identifier in response to said measuring step.

4. The method of claim 3 and further comprising the step of identifying said at least one operational characteristic in response to said determining step.

5. A method of determining at least one operational characteristic of a circuit board comprising a surface, comprising the steps of:

affixing an identification component to the surface, wherein the identification component comprises a measurable electrical characteristic and an alphanumeric identifier which identifies the at least one operational characteristic;

measuring the electrical characteristic of the identification component after said affixing step; and determining the alphanumeric identifier in response to said measuring step.

6. The method of claim 5 and further comprising the steps of:

affixing an additional plurality of identification components to the surface, wherein each of said plurality of identification components comprises a measurable electrical characteristic and an alphanumeric identifier which identifies the at least one operational characteristic; and measuring the electrical characteristic of each of said plurality of identification components.

7. A method of assembling a circuit board comprising at least one operational characteristic and a surface, comprising the steps of:

affixing alphanumeric identifiers to respective ones of a plurality of identification components, wherein each of said plurality of identification components has a measurable electrical characteristic;

selecting a subset of identification components from the plurality of identification components; and affixing the selected identification components to the surface of the circuit board, wherein the alphanumeric identifiers of the selected identification components further identify the at least one operational characteristic.

8. The method of claim 7 wherein the circuit board comprises a plurality of operational characteristics, and wherein the selected identification components combine to identify the plurality of operational characteristics.

9. A method of assembling a circuit board comprising at least one operational characteristic and a surface, comprising the steps of:

affixing an alphanumeric identifier to an identification component, wherein the identification component has a measurable electrical characteristic;

affixing the identification component to the surface, wherein the alphanumeric identifier identifies the at least one operational characteristic;

measuring the electrical characteristic of the identification component after said recited affixing steps;

determining the identifier in response to said measuring step;

identifying said at least one operational characteristic in response to said determining step;

affixing electrical components to the surface of the board; and testing the electrical components in response to said step of identifying said at least one operational characteristic.

10. A method of assembling a circuit board comprising at least one operational characteristic and a surface, comprising the steps of:

affixing an alphanumeric identifier to an identification component, wherein the identification component has a measurable electrical characteristic;

affixing the identification component to the surface, wherein the alphanumeric identifier identifies the at least one operational characteristic;

measuring the electrical characteristic of the identification component after said recited affixing steps;

determining the identifier in response to said measuring step; and comparing the identifier to an identifier corresponding to said at least one operational characteristic.

11. A method of assembling a circuit board comprising at least one operational characteristic and a surface, comprising the steps of:

affixing an alphanumeric identifier to an identification component, wherein the identification component has a measurable electrical characteristic;

affixing the identification component to the surface, wherein the alphanumeric identifier identifies the at least one operational characteristic and wherein said at least one operational characteristic corresponds to an expected alphanumeric identifier;

measuring the electrical characteristic of the identification component after said recited affixing steps; and in response to said measuring step, determining from the measured electrical characteristic the expected alphanumeric identifier.

12. The method of claim 11 and further comprising, after said determining step, comparing the expected alphanumeric identifier to the alphanumeric identifier on the identification component.

13. A method of assembling a circuit board comprising at least one operational characteristic and a surface, comprising the steps of:

affixing an alphanumeric identifier to an identification component, wherein the identification component has a measurable electrical characteristic;

affixing the identification component to the surface, wherein the alphanumeric identifier identifies the at least one operational characteristic; and wherein said step of affixing the identification component comprises affixing the identification component with a surface mount technology machine.

14. A method of determining at least one operational characteristic of a circuit board comprising a surface, comprising the steps of:

affixing an identification component to the surface, wherein the identification component comprises a measurable electrical characteristic and an alphanumeric identifier which identifies the at least one operational characteristic;

measuring the electrical characteristic of the identification component after said affixing step; and determining the at least one operational characteristic in response to said measuring step.

15. A method of determining at least one operational characteristic of a circuit board comprising a surface, comprising the steps of:

affixing an identification component to the surface, wherein the identification component comprises a measurable electrical characteristic and an alphanumeric identifier which identifies the at least one operational characteristic;

measuring the electrical characteristic of the identification component after said affixing step;

affixing an additional plurality of identification components to the surface, wherein each of said plurality of identification components comprises a measurable electrical characteristic and an alphanumeric identifier which identifies the at least one operational characteristic;

measuring the electrical characteristic of each of said plurality of identification components; and determining the identifier for the identification component and each of said plurality of identification components in response to said measuring steps.

* * * * *

UNITED STATES PATENT AND TRADEMARK OFFICE
CERTIFICATE OF CORRECTION

PATENT NO.  : 5,630,270
DATED       : May 20, 1997
INVENTOR(S) : Donna F. O'Malley It is certified that error appears in the above-indentified patent and that said Letters Patent is hereby corrected as shown below:

Column 7, line 56, after the, insert --surface--.

Signed and Sealed this

Twenty-third Day of September, 1997

Attest:

Attesting Officer

BRUCE LEHMAN

Commissioner of Patents and Trademarks